(12) United States Patent
Park

(10) Patent No.: US 8,553,465 B2
(45) Date of Patent: Oct. 8, 2013

(54) SEMICONDUCTOR MEMORY DEVICE AND METHOD OF PROGRAMMING THE SAME

(75) Inventor: Young Soo Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 145 days.

(21) Appl. No.: 13/177,700

(22) Filed: Jul. 7, 2011

(65) Prior Publication Data

US 2012/0008407 A1    Jan. 12, 2012

(30) Foreign Application Priority Data

Jul. 9, 2010  (KR) .................. 10-2010-0066510

(51) Int. Cl.
*G11C 16/04* (2006.01)
*G11C 16/06* (2006.01)

(52) U.S. Cl.
USPC ............. 365/185.28; 365/185.19; 365/185.22

(58) Field of Classification Search
USPC .................................... 365/185.28
See application file for complete search history.

(56) References Cited

U.S. PATENT DOCUMENTS

| 6,937,520 | B2 * | 8/2005 | Ono et al. | 365/185.18 |
| 7,057,936 | B2 * | 6/2006 | Yaegashi et al. | 365/185.22 |
| 7,116,581 | B2 * | 10/2006 | Suzuki et al. | 365/185.19 |
| 7,539,057 | B2 * | 5/2009 | Hwang et al. | 365/185.19 |
| 7,602,648 | B2 * | 10/2009 | Lee | 365/185.19 |
| 7,969,786 | B2 * | 6/2011 | Wang | 365/185.19 |
| 8,199,574 | B2 * | 6/2012 | Lee | 365/185.09 |

FOREIGN PATENT DOCUMENTS

| KR | 1020050106836 A | 11/2005 |
| KR | 1020070034328 A | 3/2007 |
| KR | 1020080020443 A | 3/2008 |

* cited by examiner

*Primary Examiner* — Son Mai
(74) *Attorney, Agent, or Firm* — William Park & Associates Patent Ltd.

(57) ABSTRACT

A method of programming a semiconductor memory device includes a first program step for performing a program by supplying a first program voltage, having a specific amount, to a selected word line of the semiconductor memory device for a set time and a second program step for performing a program by supplying, to the selected word line, a second program voltage which is a step pulse gradually rising from a start voltage lower than the first program voltage.

9 Claims, 4 Drawing Sheets

SEMICONDUCTOR MEMORY DEVICE AND METHOD OF PROGRAMMING THE SAME

CROSS-REFERENCE TO RELATED APPLICATION

Priority to Korean patent application number 10-2010-0066510 filed on Jul. 9, 2010, the entire disclosure of which is incorporated by reference herein, is claimed.

BACKGROUND

An exemplary embodiment relates to a method of programming a semiconductor memory device.

A semiconductor memory device is a storage device in which data can be stored and from which data can be read. The semiconductor memory device may be divided into a volatile memory device and a nonvolatile memory device. The volatile memory device requires power supply to maintain the stored data. However, the nonvolatile memory device maintains data stored in the device even in absence of power supply.

In order to increase the capacity of the semiconductor memory device, a multi-level cell (MLC) technology, using multiple levels per cell to allow more bits to be stored as opposed to a single level cell (MLC) technology, is being developed.

As mentioned above, the semiconductor memory device programmed by the MLC technology has multiple threshold voltage distributions, and the distance between each threshold voltage distribution decreases as a number of bits programmed in a cell increases. Therefore reliability of data may deteriorate.

In order to improve reliability of data stored in a MLC cell, a width of each threshold voltage distribution is controlled. Also, in order to tightly control the threshold voltage distribution of the programmed cell, an incremental step pulse programming (ISPP) is being used.

In the ISPP method, a program operation is performed by applying a programming word line voltage which stepwise increases with repetition of loops of programming cycle.

FIGS. 1A and 1B are diagrams illustrating a known ISPP method.

FIG. 1A shows voltages supplied to a word line for a program operation. FIG. 1B shows threshold voltage distributions of memory cells after the program operation is performed.

Referring to FIGS. 1A and 1B, for the program operation, a start voltage Vstart is first applied to the word line and then a program verification operation is performed by applying a program verification voltage Vverify.

After the program verification operation is completed, the program operation is performed again by applying voltage raised from the start voltage Vstart by a step voltage Vstep. Next, the program verification operation is performed again. The above program loop is repeated.

As shown in FIG. 1B, memory cells include fast cells which are fast programmed and slow cells which are slowly programmed, and thus the step voltage Vstep may have a small value in order to tightly control the threshold voltage distribution of the programmed cell. In this case, the program operation may take a long time.

BRIEF SUMMARY

An exemplary embodiment relates to a method of programming a semiconductor memory device, having an advantage of narrowing the width of a threshold voltage distribution of memory cells by performing a first program operation for widening a threshold voltage distribution of memory cells and a second program operation for programming the memory cells having the wide threshold voltage distribution.

A method of programming a semiconductor memory device according to an aspect of the present disclosure includes a first program step for performing a program by supplying a first program voltage, having a specific amount, to a selected word line of the semiconductor memory device for a set time and a second program step for performing a program by supplying, to the selected word line, a second program voltage which is a step pulse gradually rising from a start voltage lower than the first program voltage.

A semiconductor memory device according to another aspect of the present disclosure includes a memory cell array configured to include a plurality of memory cells, peripheral circuits configured to store data in the memory cells and reading data stored in the memory cells, and a controller configured to control the peripheral circuits so that, in a program mode, a first program voltage having a specific amount is supplied to a selected word line for a set time and a second program voltage which is a step pulse gradually rising from a start voltage lower than the first program voltage is supplied to the selected word line.

DESCRIPTION OF EMBODIMENT

Hereinafter, an exemplary embodiment of the present disclosure will be described in detail with reference to the accompanying drawings. The figures are provided to allow those having ordinary skill in the art to understand the scope of the embodiment of the disclosure.

Figure 1A:
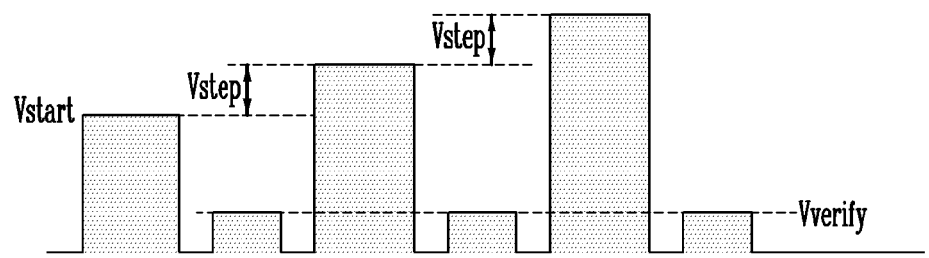
FIGS. 1A and 1B are diagrams illustrating a known ISPP method.
Figure 1B:
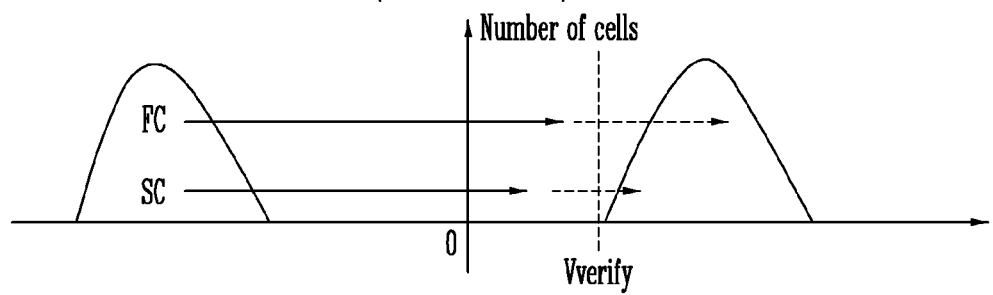
Figure 2:
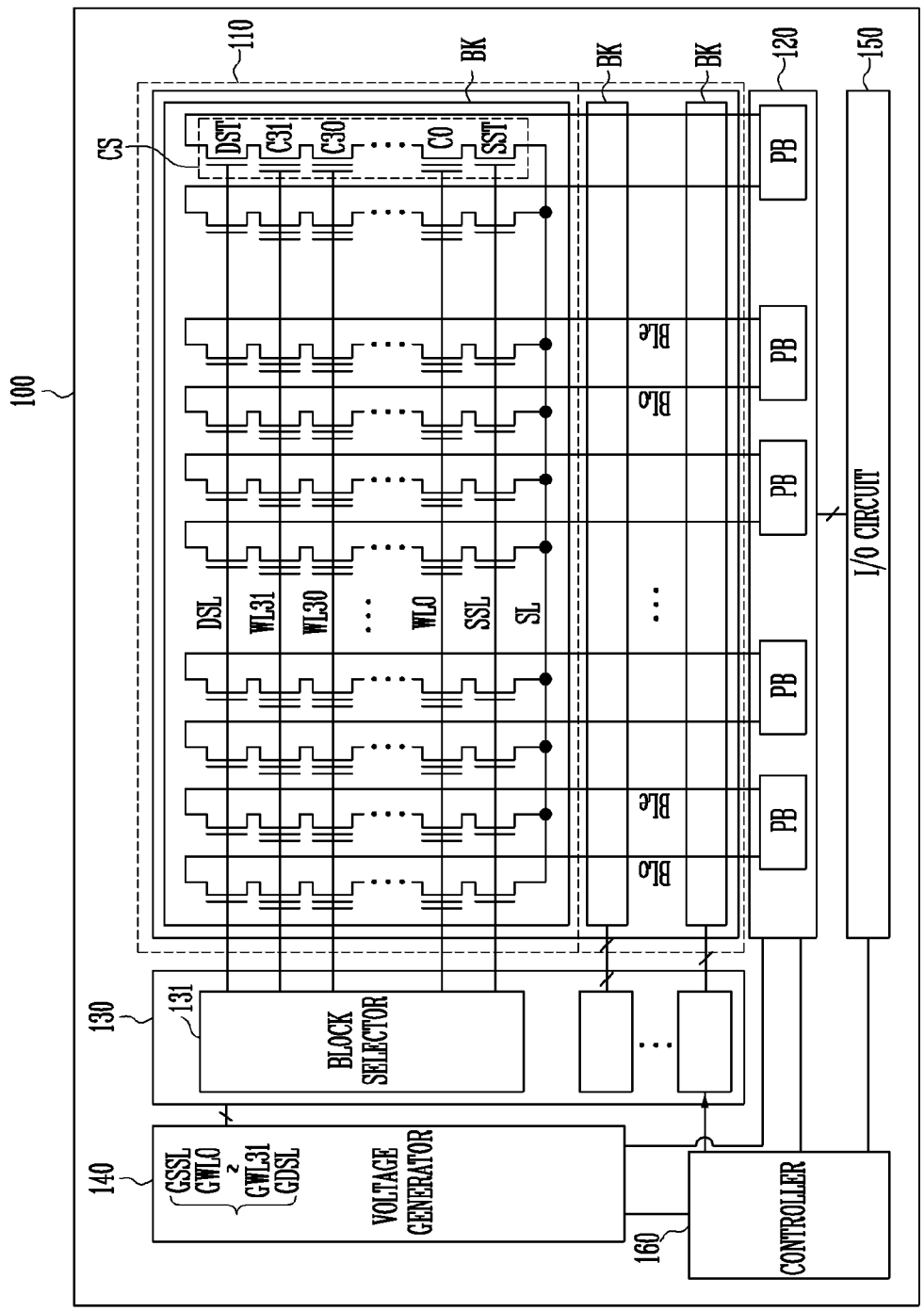
FIG. 2 shows a semiconductor memory device illustrating this disclosure.

FIG. 2 shows a semiconductor memory device illustrating this disclosure.

Referring to FIG. 2, the semiconductor memory device 100 includes a memory cell array 110, a page buffer group 120, an X decoder 130, a voltage generator 140, an I/O circuit 150, and a controller 160.

The memory cell array 100 includes a plurality of memory block BK. Each of the memory blocks BK includes a plurality of cell strings.

Each of the cell strings includes, for example, $0^{th}$ to $31^{st}$ memory cells C0 to C31 coupled in series between a drain select transistor DST and a source select transistor SST.

The gate of the drain select transistor DST is coupled to a drain select line DSL, and the gate of the source select transistor SST is coupled to a source select line SSL.

The gates of the $0^{th}$ to the $31^{st}$ memory cells C0 to C31 are coupled to $0^{th}$ to $31^{st}$ word lines WL0 to WL31, respectively.

The drain of the drain select transistor DST is coupled to a bit line. According to an example, the bit line is divided into an even bit line BLe and an odd bit line BLo.

The source of the source select transistor SST is coupled to a common source line SL.

The page buffer group 120 includes a plurality of page buffers PB operated for a program operation, a read operation, and so on.

According to an example, each of the page buffers PB is coupled to a pair of the even bit line BLe and the odd bit line BLo.

The I/O circuit 150 performs data input and output operations between the page buffer group 120 and the outside.

The X decoder 130 includes a plurality of block selectors 131. Each block selector 131 is coupled to each memory block BK.

The block selector 131 couples the drain select line DSL, the source select line SSL, and the $0^{th}$ to the $31^{st}$ word lines WL0 to WL31 of the memory block BK to the global source select line GSSL, the global drain select line GDSL, and the $0^{th}$ to $31^{st}$ global word lines GWL0 to GWL31 of the voltage generator 140, respectively, in response to control signals generated by the controller 160.

The voltage generator 140 generates operating voltages in response to the control signals of the controller 160 and supplies the operating voltages to the global lines GSSL, GDSL, and GWL0 to GWL31.

The controller 160 generates the control signals for controlling the operations of the page buffer group 120, the X decoder 130, the I/O circuit 150, and the voltage generator 140 of the semiconductor memory device 100.

Figure 3:
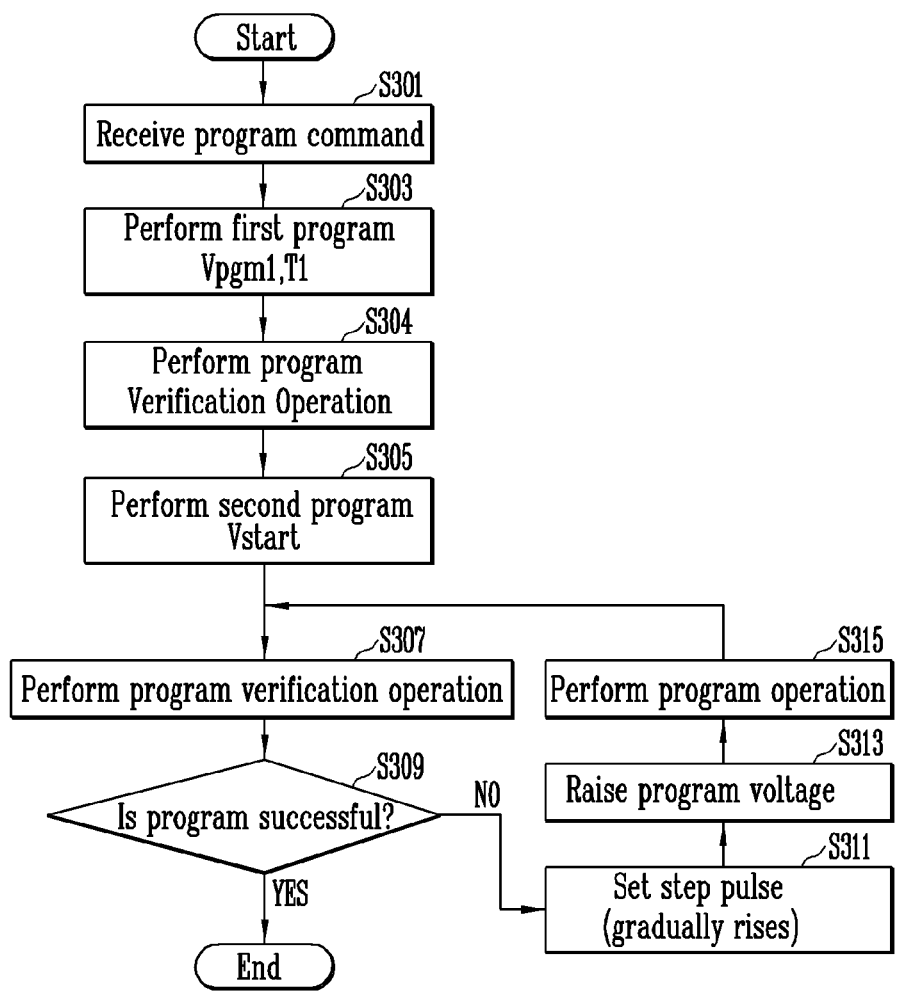
FIG. 3 is a flowchart illustrating a program method according to an exemplary embodiment of this disclosure.
Figure 4:
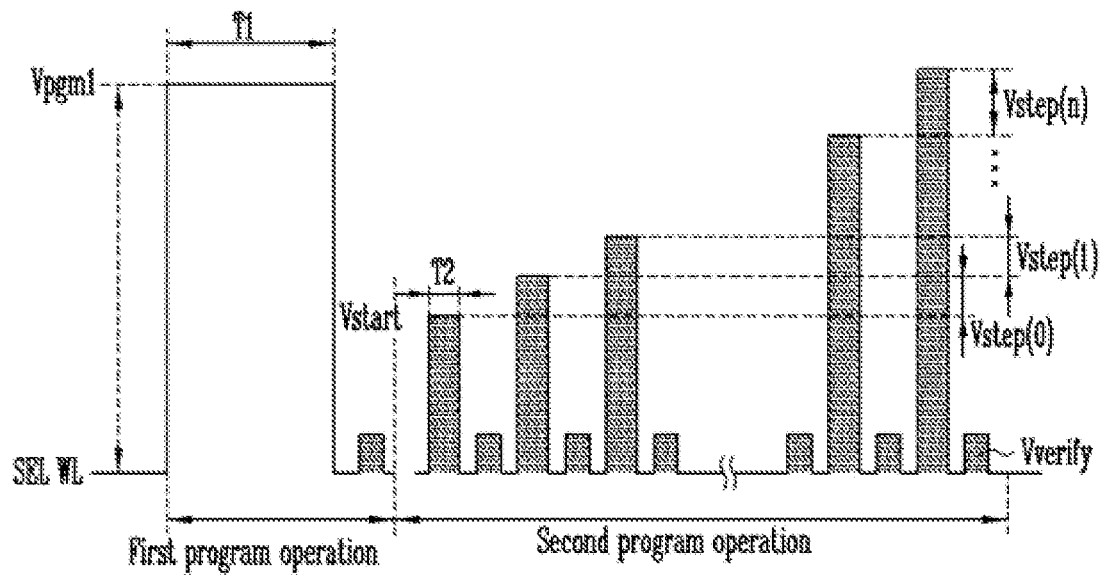
FIG. 4 shows voltages supplied to a selected word line in the program method of FIG. 3.
Figure 5A:
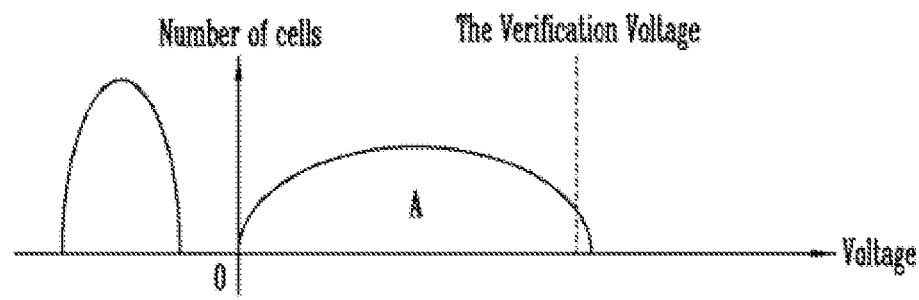
FIGS. 5A and 5B illustrate a shift of threshold voltage distribution according to the program method of FIG. 4.
Figure 5B:
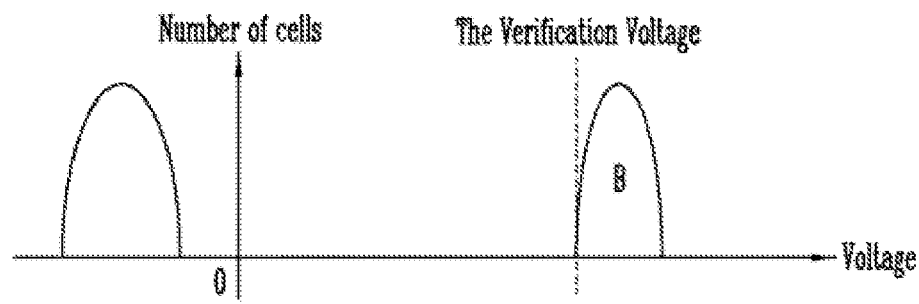

FIG. 3 is a flowchart illustrating a program method according to an exemplary embodiment of this disclosure. FIG. 4 shows voltages supplied to a selected word line in the program method of FIG. 3. FIGS. 5A and 5B illustrate a shift of threshold voltage distribution according to the program method of FIG. 4.

Referring to FIG. 3, when a program command is received at step S301, the controller 160 performs a first program operation during a first time T1 for which a first program voltage Vpgm1 is applied to a word line SEL WL at step S303.

Referring to FIG. 4, during the first time T1, the first program voltage Vpgm1 is applied so that the threshold voltage of a fast cell, from among memory cells, becomes higher than a verification voltage Vverify. According to an example, the first program voltage Vpgm1 and the first time T1 are determined so that the threshold voltage of the fastest memory cell becomes higher than the verification voltage.

The first program voltage Vpgm1 and the first time T1 may be previously set in the manufacturing process of the semiconductor memory device 100.

For example, in a test stage (that is, the final stage of the manufacturing process), a reference memory block may be selected, and a program voltage in which the threshold voltages of memory cells of the memory block can shift from an erase state to the verification voltage may be determined.

Also, the first time T1 during which the first program voltage Vpgm1 is applied may be set in inverse proportion to the first program voltage Vpgm1.

After the first program operation is performed, the memory cells have a wide threshold voltage distribution A, as shown in FIG. 5A. Fast cells, for example, have threshold voltages close to the verification voltage Vverify, and slow cells, for example, have threshold voltages close to 0 V.

Referring again to FIG. 3, after the first program operation is performed, a program verification operation S304 may be performed. Here, the program verification operation S304 may be omitted.

If the program verification operation is not performed after the first program operation, the entire program time may decrease.

Next, a second program operation is performed at step S305.

The second program operation is performed by applying a start voltage Vstart as a program voltage. The time for which the program voltage is applied may be identical to that of a known program operation.

The start voltage Vstart is lower than the first program voltage Vpgm1, and the time T2 for which the program voltage is applied in the second program operation is shorter than the first time T1.

After the second program operation is performed, a program verification operation is performed at step S307.

If, as the result of the program verification operation, all the memory cells have been successfully programmed, the above program loop is terminated.

However, if, as the result of the program verification operation, all the memory cells have not been successfully programmed, a step voltage (i.e. voltage difference between a pulse and the next pulse) is set at step S311, the program voltage is raised by the step voltage at step S313, and a program operation is performed by applying the raised program voltage at step S315.

According to an example, the step voltages are set so that the last step voltage is larger than the first step voltage. Also, each step voltage may have a different value, and thus the step voltage may gradually increase from Vstep(0) to Vstep(n), e.g., the step voltage Vstep(n) is larger than the step voltage Vstep(1) and the step voltage Vstep(1) is larger than the step voltage Vstep(0).

After the program operation using the raised program voltage is performed, the program verification operation is performed at step S307.

FIG. 4 shows that, in the second program operation, the step pulse Vstep of the program voltage is gradually raised.

From FIGS. 5A and 5B, it can be seen that, during the second program operation, the wide threshold voltage distribution (A) becomes a narrow threshold voltage distribution (B).

The speed that slow cells and fast cells are programmed can be controlled through the above program method. Accordingly, the width of a threshold voltage distribution may be tightly controlled and the program operation time may decrease. Furthermore, although the program method is described in the embodiment of this disclosure, the program method of this disclosure may also be applied to a soft program performed after an erase operation.

What is claimed is:

1. A method of programming a semiconductor memory device, comprising:
   a first program step for performing a program by supplying a first program voltage, having a specific level, to a selected word line of the semiconductor memory device for a set time; and
   a second program step for performing a program by supplying, to the selected word line, a second program voltage which includes step pulses gradually rising from a start voltage lower than the first program voltage,
   wherein each of the step pulses is supplied during a time shorter than the set time for which the first program voltage is supplied.

2. The method of claim 1, wherein the second program step includes performing the program by supplying each of the step pulses and then performing each of program verifications using a program verification voltage.

3. The method of claim 1, wherein a degree that the step pulses of the second program voltage is increased is gradually increased.

4. The method of claim 1, further comprising setting a test voltage, supplied to a specific word line of the semiconductor memory device when programming at least one of memory cells coupled to the specific word line in a test mode, as the first program voltage, before the first program step is performed.

5. The method of claim 4, wherein setting the first program voltage comprises:
   supplying the test voltage to the specific word line of the semiconductor memory device; and
   setting, as the first program voltage, the test voltage when programming the at least one of memory cells coupled to the specific word line.

6. The method of claim 1, further comprising performing program verification for the first program, before performing the second program step.

7. A semiconductor memory device, comprising:
   a memory cell array configured to comprise a plurality of memory cells;
   peripheral circuits configured to store data in the memory cells and read data stored in the memory cells; and
   a controller configured to control the peripheral circuits so that, in a program mode, a first program voltage having a specific level is supplied to a selected word line for a set time and a second program voltage which includes step pulses gradually rising from a start voltage lower than the first program voltage is supplied to the selected word line,
   wherein each of the step pulses is supplied during a time shorter than the set time for which the first program voltage is supplied.

8. A method of programming a semiconductor memory device, comprising:
   performing a first program operation by applying a first program voltage, having a specific level, to a selected word line of the semiconductor memory device; and
   performing a second program operation by applying incremental step pulses to the selected word line of the semiconductor memory device, wherein the amplitude of the first program voltage pulse is larger than a start voltage of the incremental step pulses of the second program operation, wherein a step voltage of the incremental step pulses of the second program operation increases, and wherein the duration of the first program voltage is longer than each of the incremental step pulses of the second program operation.

9. The method of claim 8, wherein the second program operation includes applying a program verification voltage after applying each program voltage.

* * * * *